(12) United States Patent
Yaegashi et al.

(10) Patent No.: US 9,613,971 B2
(45) Date of Patent: Apr. 4, 2017

(54) SELECT GATES WITH CENTRAL OPEN AREAS

(71) Applicant: SanDisk Technologies LLC, Plano, TX (US)

(72) Inventors: Masahiro Yaegashi, Yokkaichi (JP); Kota Funayama, Yokkaichi (JP); Takeshi Kawamura, Yokkaichi (JP); Dai Iwata, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/808,475

(22) Filed: Jul. 24, 2015

(65) Prior Publication Data

US 2017/0025425 A1    Jan. 26, 2017

(51) Int. Cl.
| | | |
|---|---|---|
| *H01L 27/11* | (2006.01) | |
| *H01L 27/11524* | (2017.01) | |
| *H01L 29/49* | (2006.01) | |
| *H01L 29/40* | (2006.01) | |
| *H01L 21/265* | (2006.01) | |
| *H01L 21/28* | (2006.01) | |
| *H01L 29/788* | (2006.01) | |
| *H01L 29/167* | (2006.01) | |
| *H01L 21/768* | (2006.01) | |
| *H01L 21/02* | (2006.01) | |
| *H01L 23/528* | (2006.01) | |

(52) U.S. Cl.
CPC .. *H01L 27/11524* (2013.01); *H01L 21/02148* (2013.01); *H01L 21/02164* (2013.01); *H01L 21/26513* (2013.01); *H01L 21/26586* (2013.01); *H01L 21/28273* (2013.01); *H01L 21/768* (2013.01); *H01L 23/528* (2013.01); *H01L 29/167* (2013.01); *H01L 29/401* (2013.01); *H01L 29/495* (2013.01); *H01L 29/7883* (2013.01)

(58) Field of Classification Search
CPC ......... H01L 27/11524; H01L 21/02148; H01L 21/02164; H01L 21/26513; H01L 21/26586; H01L 21/28273; H01L 21/768; H01L 23/528; H01L 29/167; H01L 29/401; H01L 29/495; H01L 29/7883
See application file for complete search history.

(56) References Cited

U.S. PATENT DOCUMENTS

| | | |
|---|---|---|
| 5,570,315 A | 10/1996 | Tanaka et al. |
| 5,774,397 A | 6/1998 | Endoh et al. |
| 5,887,145 A | 3/1999 | Harari et al. |
| 6,046,935 A | 4/2000 | Takeuchi et al. |
| 6,518,642 B2 | 2/2003 | Kim et al. |
| 7,951,669 B2 | 5/2011 | Harari et al. |
| 9,269,718 B1 | 2/2016 | Kuge et al. |

(Continued)

OTHER PUBLICATIONS

"Notice of Allowance and Fee(s) Due mailed Apr. 22, 2016," U.S. Appl. No. 14/808,463, filed Jul. 24, 2015, 10 pages.

(Continued)

*Primary Examiner* — Armando Rodriguez
(74) *Attorney, Agent, or Firm* — Foley & Lardner LLP

(57) ABSTRACT

A NAND flash memory array includes a select line having a first edge region containing a first portion of floating gate material and a second edge region containing a second portion of floating gate material, and having a central region between the first edge region and the second edge region where no floating gate material is present.

16 Claims, 15 Drawing Sheets

(56) References Cited

U.S. PATENT DOCUMENTS

| | | | |
|---|---|---|---|
| 2002/0130374 A1 | 9/2002 | Ueno et al. |
| 2005/0082602 A1 | 4/2005 | Okajima |
| 2006/0030109 A1 | 2/2006 | Ranade et al. |
| 2007/0012979 A1 | 1/2007 | Song et al. |
| 2007/0057316 A1 | 3/2007 | Yaegashi |
| 2008/0093656 A1 | 4/2008 | Jeon et al. |
| 2008/0315280 A1 | 12/2008 | Watanabe et al. |
| 2010/0314679 A1 | 12/2010 | Lee |
| 2011/0049611 A1 | 3/2011 | Kiyotoshi et al. |
| 2012/0032246 A1 | 2/2012 | Honda et al. |
| 2012/0146125 A1 | 6/2012 | Kim et al. |
| 2012/0241836 A1 | 9/2012 | Kuge et al. |
| 2012/0241838 A1 | 9/2012 | Nagashima et al. |
| 2013/0161716 A1 | 6/2013 | Kim et al. |
| 2013/0252388 A1 | 9/2013 | Matsuno |
| 2014/0015030 A1 | 1/2014 | Han et al. |
| 2014/0097482 A1 | 4/2014 | Tokunaga et al. |
| 2014/0264537 A1 | 9/2014 | Sakamoto et al. |
| 2015/0380420 A1 | 12/2015 | Fujikura et al. |
| 2016/0064276 A1 | 3/2016 | Akasaki et al. |
| 2016/0064345 A1 | 3/2016 | Shimoda et al. |

OTHER PUBLICATIONS

"Non-Final Rejection mailed Jun. 2, 2016," U.S Appl. No. 14/808,542, filed Jul. 24, 2015, 10 pages.

Iwata et al., U.S. Appl. No. 14/808,463 entitled "Select Gates with Select Gate Dielectric First", filed Jul. 24, 2015. 49 pages.

Kano et al., U.S. Appl. No. 14/808,542 entitled "Select Gates with Conductive Strips on Sides", filed Jul. 24, 2015. 49 pages.

"Final Rejection mailed Nov. 17, 2016," U.S. Appl. No. 14/808,542, filed Jul. 24, 2015, 18 pages.

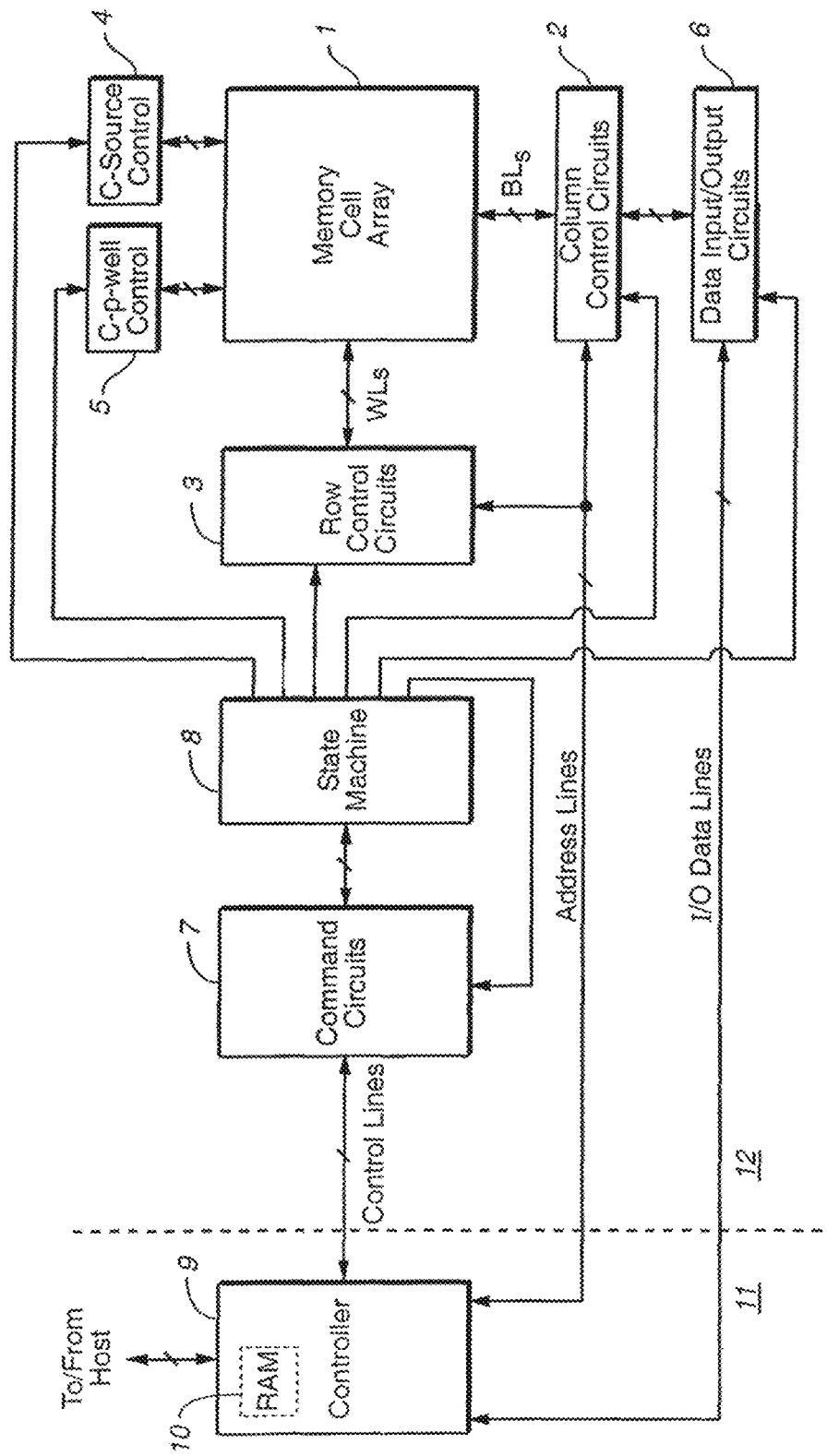
FIG._1
*(Prior Art)*

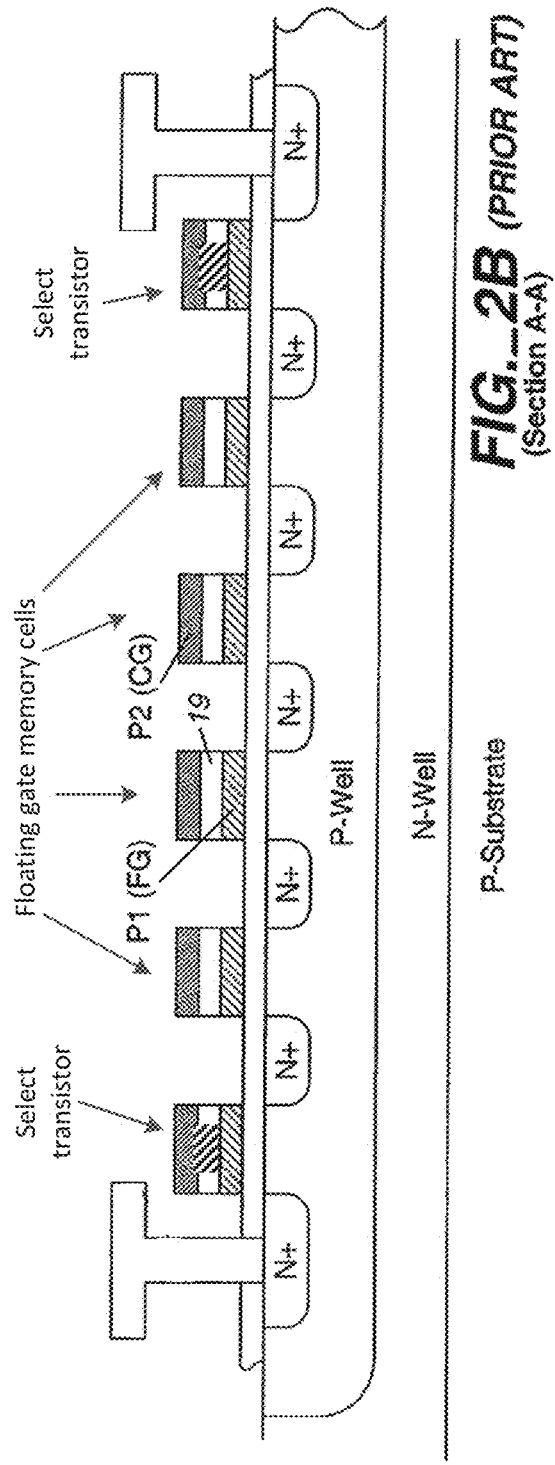
FIG._2B (PRIOR ART)
(Section A-A)

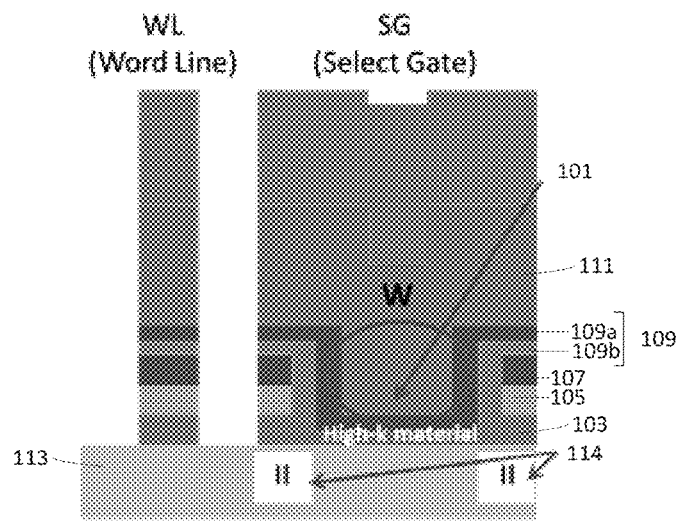
FIG. 10
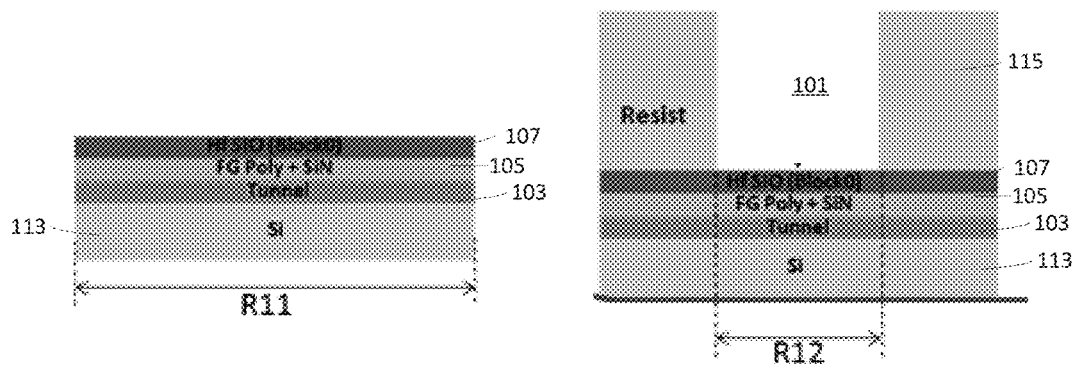
FIG. 11A  FIG. 11B

SELECT GATES WITH CENTRAL OPEN AREAS

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom ends of the string connect to the bit line and a common source line respectively through select transistors (source select transistor and drain select transistor) in which the floating gate material (P1) is in direct contact with the control gate material (P2) through an opening formed in interpoly dielectric (IPD) material. The active gate thus formed is electrically driven from the periphery. Transistors in peripheral circuits are similarly formed by connecting floating gate material, P1, to overlying control gate material, P2, to form an active gate.

Select transistors and peripheral circuits are formed on the same chip as the memory cells but they have very different functions that require different device structures. Thus, a process that is adapted for forming a memory array may not be ideal for forming peripheral circuits and vice versa. In general, the cost of manufacturing a memory chip increases with the number of processing steps used, and the number of defective units may tend to increase also. So it is desirable to use the same process steps for both the memory array and peripheral circuits.

Thus, there is a need for a memory chip manufacturing process that forms the memory cells, select transistors, and peripheral circuits in an efficient manner and there is a need for structures that can be formed accordingly.

SUMMARY

In some NAND flash memories, a floating gate layer (e.g. floating gate polysilicon) is very thin, which may make etching through an IPD layer and stopping within the floating gate layer difficult. Under-etching may leave IPD in place so that a unitary gate is not formed. Over-etching may damage a gate dielectric. Thus, forming a unitary gate in select transistors may present challenges. One approach is to add conductive strips along sides of select gates so that etching through IPD is unnecessary. Electrical connection between the floating gate layer and control gate layer is provided by a conductive strip along a side so that a unitary gate is formed with the IPD layer remaining in place. Another approach is to continue etching down to the substrate instead of stopping at the floating gate layer. Then, a new select gate dielectric can be formed on the exposed area of the substrate surface and the control gate layer can be directly deposited on the select gate dielectric. Another approach is to form portions of select gate dielectric first, then deposit the gate stack including gate dielectric (for memory cells), floating gate layer, and IPD layer(s) over the select gate dielectric, then etch through the gate stack (including thin floating gate layer), stopping on or above the select gate dielectric portion.

An example of a method of forming a NAND flash memory array includes: forming a gate stack on a surface of a semiconductor substrate, the gate stack comprising: a floating gate layer, an interpoly dielectric (IPD) layer, and a control gate layer; subsequently patterning the gate stack to form separate floating gates and word lines in a first area; forming an opening in the gate stack in a second area where select lines are to be located; and subsequently forming conductive strips along sidewalls of the opening.

The conductive strips may electrically connect the floating gate layer and the control gate layer in the second area to form a unitary gate of a select transistor. Forming the conductive strips may include: depositing a conductive material along exposed surfaces; and subsequently performing anisotropic etching to remove the conductive material from a bottom surface of the opening and from areas around the opening. A dielectric layer may be deposited over the conductive strips. Vertical contact plugs may be formed in the opening, the vertical contact plugs separated from the conductive strips by the dielectric layer. Subsequent to patterning the gate stack, a protective layer may be formed over the gate stack; and subsequently the opening may be formed through the protective layer and through the gate stack. The opening may taper with increasing depth so that the sidewalls of the opening form an oblique angle with respect to the surface of the substrate. Forming the opening may include etching down to a gate dielectric layer, stopping on the gate dielectric layer, and the conductive strips may subsequently be separated from the surface of the substrate by the gate dielectric layer. Forming the opening may include etching down to the surface of the substrate and may further include depositing an insulator on an exposed area of the substrate along a bottom surface of the opening, the insulator subsequently separating the conductive strips from the substrate.

An example of a method of forming a NAND flash memory includes: depositing a floating gate polysilicon layer over a substrate; subsequently, depositing an interpoly dielectric layer over the floating gate polysilicon layer; subsequently, depositing a control gate polysilicon layer over the interpoly dielectric layer; subsequently, patterning a stack of layers including the floating gate polysilicon layer, the interpoly dielectric layer, and the control gate polysilicon layer to form word lines and select lines; and subsequently, forming an electrically conductive portion along a sidewall of a select line, the electrically conductive portion electrically connecting floating gate polysilicon and control gate polysilicon in the select line.

The patterning may include forming a tapered opening between select lines that have inclined sidewalls. The electrically conductive portion may be formed by depositing a blanket layer of conductive material and etching back the conductive material to remove the conductive material from a bottom surface of the tapered opening and from over the select lines and word lines. A dielectric layer may subsequently be formed over the electrically conductive portion. Vias may subsequently be formed extending to contact areas at the bottom surface of the tapered opening, the vias separated from the conductive portion by the dielectric layer.

An example of a NAND flash memory array includes: a plurality of floating gates formed of a first conductive layer; a plurality of word lines formed of a second conductive layer extending along a first direction over the plurality of floating gates; an interpoly dielectric between word lines and floating gates; and a select line extending along the first direction, the select line formed from a portion of the first conductive layer, a portion of second conductive layer, and a connecting portion of a third conductive layer, the connecting portion extending in contact with a side of the portion of the first conductive layer and a side of the portion of the second conductive layer.

The first conductive layer and the second conductive layer may be formed of doped polysilicon and the third conductive layer may be formed of doped amorphous silicon or metal. An insulating layer may be located between the connecting portion and a substrate surface. A portion of the interpoly dielectric may extend between the portion of the first conductive layer and the portion of the second conductive layer so that there is no direct contact between the portion of the first conductive layer and the portion of the second conductive layer. A dielectric layer may overlie the connecting portion. The second conductive layer may be formed of a doped polysilicon layer and a tungsten layer on the doped polysilicon layer, and the connecting portion may extend in direct contact with the doped polysilicon layer and the tungsten layer.

An example of a NAND flash memory array includes: a plurality of word lines extending in a first direction over a substrate surface; a plurality of select lines extending in the first direction over the substrate surface; and an individual select line having a first edge region containing a first portion of floating gate material and a second edge region containing a second portion of floating gate material, and having a central region between the first edge region and the second edge region where no floating gate material is present.

In the central region, a conductive metal layer may directly overlie a dielectric layer that directly overlies the substrate surface, and in the first and second edge regions, the conductive metal layer may overlie the first and second portions of floating gate material and may be separated from the first and second portions of floating gate material by the dielectric layer. The first and second portions of floating gate material may be isolated from the substrate by a tunnel dielectric layer. First and second implanted areas may be formed in the substrate, the first and second implanted areas located under the first and second edge regions. An unimplanted area in the substrate may be located under the central region of the select line, between the first and second implanted areas and having no implanted dopant or low implanted dopant concentration compared with the first and second implanted areas. The first and second edge regions may contain a stack of layers on a substrate surface including: a tunnel dielectric layer on the substrate surface; a floating gate layer on the tunnel dielectric layer; a first interpoly dielectric (IPD) layer on the floating gate layer; a second IPD layer on the first IPD layer; a third IPD layer on the second IPD layer; and a conductive metal layer on the third IPD layer. The central region may contain a stack of layers on the substrate including: the second IPD layer directly on the substrate surface; the third IPD layer on the second IPD layer; and the conductive metal layer on the third IPD layer. The tunnel dielectric layer may be formed of silicon oxide, the floating gate layer may be formed of polysilicon, the first IPD layer may be formed of hafnium silicate, the second IPD layer may be formed of silicon oxide, the third IPD layer may be formed of hafnium silicate, and the conductive metal layer may be formed of tungsten. The central region may contain a stack of layers on the substrate including: a select gate dielectric layer lying directly on the substrate surface, the select gate dielectric layer consisting of silicon oxide; and the conductive metal layer directly on the select gate dielectric layer.

An example of a method of forming a NAND flash memory array includes: forming a tunnel dielectric layer directly on a substrate surface; forming a floating gate layer directly on the tunnel dielectric layer; forming a first dielectric layer directly on the floating gate layer, subsequently forming an opening through the first dielectric layer, through the floating gate layer, and through the tunnel dielectric layer in a central area where a select line is to be formed; subsequently forming a second dielectric layer that overlies the first dielectric layer and extends along exposed surfaces of the opening; subsequently depositing a control gate layer over the second dielectric layer; and subsequently patterning and etching to form separate word lines and select lines, the patterning and etching forming the select line with edge areas on either side of the central area, the edge areas containing electrically isolated portions of the floating gate layer.

The electrically isolated portions of the floating gate layer may be isolated from the control gate layer by the second dielectric layer. The second dielectric layer may be formed directly on the substrate surface in the central area thereby forming a gate dielectric for select transistors. Subsequent to forming the opening through the first dielectric layer and through the floating gate layer, portions of the substrate may be implanted through the opening. Implanting may include implantation of at least one of: arsenic and phosphorous. The implanting may be performed with ions directed at oblique angles to the substrate surface so that implanted portions of the substrate are substantially confined to the edge areas. Subsequent to the implanting, a silicon oxide layer may be formed along the substrate surface in the opening and subsequently the silicon oxide layer may be removed to expose the substrate surface.

An example of a method of forming a NAND flash memory array includes: forming a tunnel dielectric layer directly on a substrate surface; forming a floating gate layer directly on the tunnel dielectric layer; forming a first dielectric directly on the floating gate layer; subsequently forming an opening through the first dielectric and through the floating gate layer in a central area where a select line is to be formed, thereby exposing the substrate surface in the central area; subsequently implanting ions into the substrate to form doped regions, the ions implanted through the opening obliquely with respect to the substrate surface to thereby confine the doped regions to areas adjacent to a bottom surface of the opening without significantly doping an area directly under the bottom surface of the opening; subsequently forming a second dielectric directly on the substrate surface that is exposed in the central area, the second dielectric extending up sides of the opening to cover sides of the floating gate layer, and extending over the first dielectric around the opening; subsequently depositing a control gate layer; and subsequently patterning and etching to form separate word lines and select lines, the patterning and etching forming a select gate that contains edge areas on either side of the central area, the edge areas containing electrically isolated portions of the floating gate layer.

The first dielectric may consist of silicon oxide and/or hafnium silicate. The ions may include arsenic ions and/or phosphorous ions. The central area may include more than half of the select gate and the edge areas may include less than half of the select gate.

An example of a NAND flash memory includes: a plurality of floating gate memory cells disposed on a substrate surface, each of the plurality of floating gate memory cells formed of a stack of layers that includes a tunnel dielectric layer, a floating gate layer, an interpoly dielectric layer, and a control gate layer; and a plurality of select transistors disposed on the substrate surface, an individual select transistor having a first region formed of the stack of layers on the substrate surface, and a second region that includes an opening through the interpoly dielectric layer, the floating gate layer, and the tunnel dielectric layer, the opening separated from the substrate surface by a select gate dielectric on the substrate surface, the opening filled by the control gate layer.

A third region may be located between the first region and the second region, the third region formed of the stack of layers over the select gate dielectric on the substrate surface. The select transistor may also include a conductive portion, the conductive portion lying between the select gate dielectric and the control gate layer in the second region and lying between the select gate dielectric and the stack in the third region. The second region may extend to an edge of the select transistor. The second region may be in an interior area of the select transistor and may not extend to an edge of the select transistor. Edges of the select transistor may extend through the stack of layers. The tunnel dielectric layer may consist of silicon oxide, the floating gate layer may consist of doped polysilicon, the interpoly dielectric layer may be a compound layer that includes silicon oxide and hafnium silicate, and the control gate layer may comprise tungsten. The floating gate layer may have a thickness that is less than ten nanometers (10 nm).

An example of a method of forming a NAND flash memory array includes: forming a select gate dielectric on a substrate surface at a location where a select gate is to be formed; subsequently forming a tunnel dielectric layer over the substrate surface and over the select gate dielectric; subsequently forming a floating gate layer over the tunnel dielectric layer; subsequently forming an interpoly dielectric layer over the floating gate layer; subsequently forming an opening through the interpoly dielectric layer, through the floating gate layer, and through the tunnel dielectric layer, the opening separated from the substrate surface by the select gate dielectric; subsequently depositing a conductive material; and subsequently patterning and etching to form separate word lines and select lines, the select gate formed to include a first region where the conductive material is separated from the substrate by the interpoly dielectric layer, the floating gate layer and the tunnel dielectric layer, and a second region where the conductive material extends through the opening in the interpoly dielectric layer, the floating gate layer, and the tunnel dielectric layer.

Forming the select gate dielectric may include depositing a blanket layer of dielectric and subsequently etching through an etch mask to leave the select gate dielectric only where select gates are to be formed. Prior to the etching through the etch mask, a blanket layer of polysilicon may be deposited over the blanket layer of dielectric so that a portion of the polysilicon subsequently lies between the select gate dielectric and the tunnel dielectric. The opening may extend at least partially through the portion of the polysilicon and the conductive material may subsequently be deposited directly on the polysilicon. The select gate dielectric may have a first width, the opening may have a second width that is less than the first width, and the opening may be aligned to overlie a central area of the select gate dielectric. The patterning and etching may form the select gate with the second region in a central part of the select gate, the second region separated from edges by regions that include portions of the floating gate layer and the interpoly dielectric layer. The patterning and etching may form the select gate with the second region extending to an edge of the select gate. The opening may be formed in an etch process that also etches peripheral areas where peripheral transistors are to be formed.

An example of a method of forming a NAND flash memory array includes: forming a select gate dielectric on a substrate surface at a location where a select gate is to be formed; subsequently forming a tunnel oxide layer over the substrate surface and over the select gate dielectric; subsequently forming a doped polysilicon floating gate layer over the tunnel oxide layer; subsequently forming an interpoly dielectric layer over the doped polysilicon floating gate layer, the interpoly dielectric layer including one or more of: silicon oxide and hafnium silicate; subsequently forming an opening through the interpoly dielectric layer, through the doped polysilicon floating gate layer, and through the tunnel oxide layer, the opening aligned with the select gate dielectric so that the select gate dielectric remains between the opening and the substrate surface; subsequently depositing a metal over the interpoly dielectric and into the opening thereby filling the opening with the metal; and subsequently patterning and etching to form separate word lines and select lines, the select gate formed to include a gate-stack region where the metal is separated from the substrate surface by the interpoly dielectric layer, the doped polysilicon floating gate layer and the tunnel oxide layer, and a metal-filled region where no interpoly dielectric layer, floating gate polysilicon layer, or tunnel oxide layer remain between the metal and the substrate surface.

Only the select gate dielectric may remain between the metal and the substrate surface in the metal-filled region. The patterning and etching may form the select gate with the gate-stack region extending to a first edge of the select gate and the metal-filled region extending to an opposing second edge of the select gate. The patterning and etching may form the select gate with the metal-filled region in a central part of the select gate and with gate-stack regions along edges of the select gate.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.

FIG. 2B shows a cross section of the NAND array of FIG. 2A.

FIG. 10 shows an example of a select gate structure.

FIGS. 11A-J show an example of formation of select gates of FIG. 10.

DETAILED DESCRIPTION OF EXEMPLARY EMBODIMENTS

Memory System

Figure 2A:
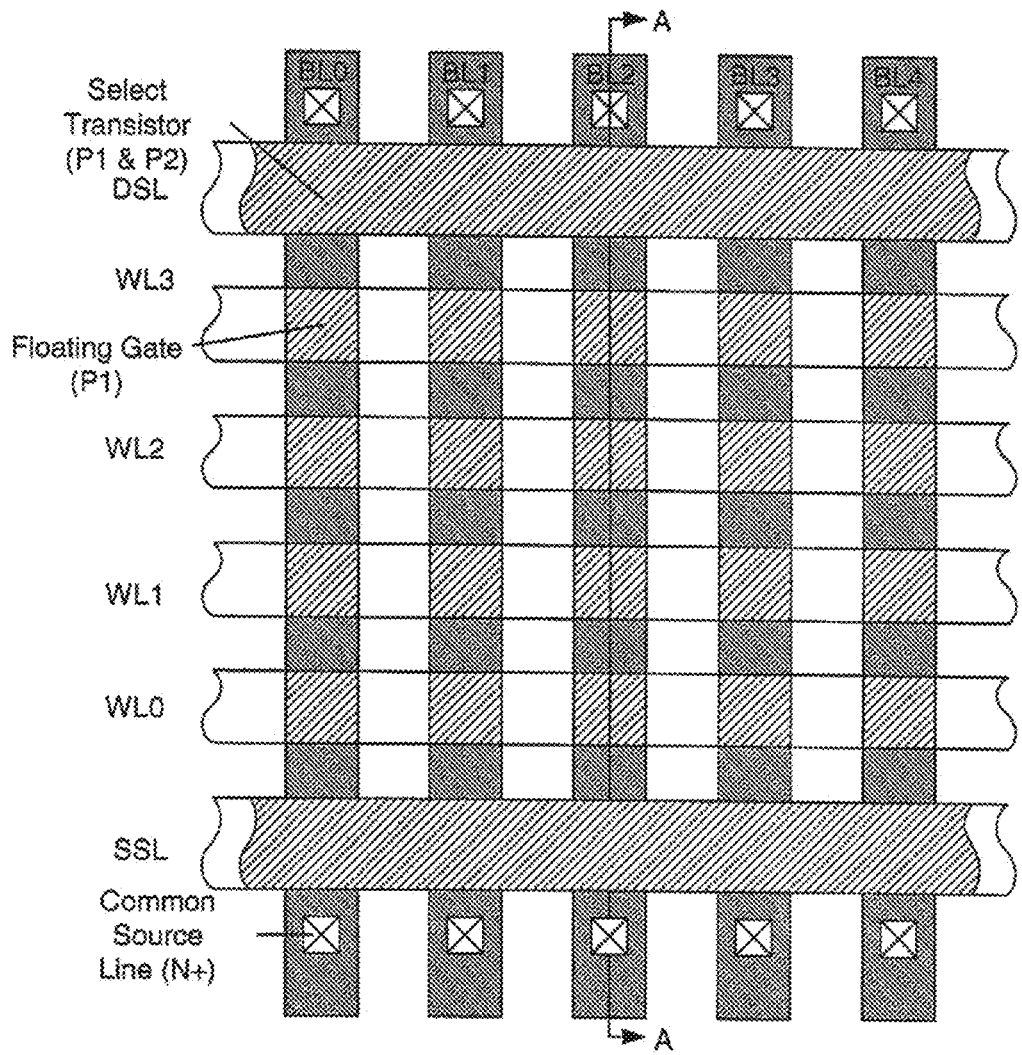
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Word lines extend to hookup areas where contact pads are formed that allow word lines to be connected to word line driver circuits.

Figure 3:
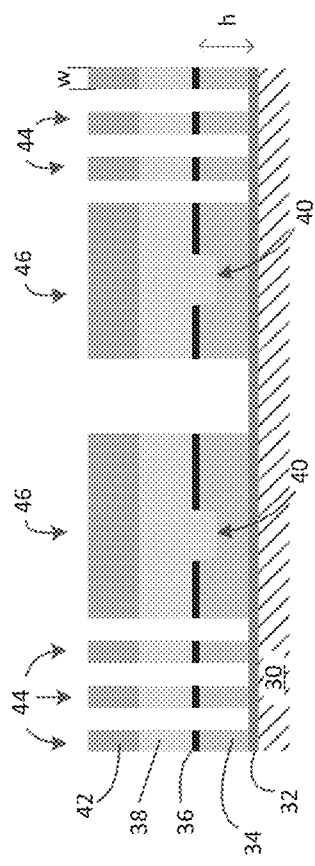
FIG. 3 illustrates select transistors in cross section.

FIG. 3 illustrates a typical prior art NAND array such as shown in FIGS. 2A-B, which includes control gate (word) lines extending over rows of floating gates with a suitable insulating dielectric layer in between. One control gate (word) line is used for each row of floating gates. In order to make an array with the floating and control gates self-aligned in a y-direction (along the lengths of the NAND strings), the same mask is generally used to form the control gates and to form the floating gates, which then have the same dimensions in the y-direction as the control gates. A single etch step may be used to form such control gate/floating gate stacks and to also define select gates.

FIG. 3 shows a cross section of a portion of a NAND flash memory array at an intermediate stage of fabrication showing the layers of materials (after patterning to form separate memory cells and select transistors) according to an example. The cross-section of FIG. 3 corresponds to FIG. 2B (i.e. cross section along NAND string direction) where two NAND strings, each with a separate select gate 46 terminate. A gate dielectric (tunnel dielectric) layer 32 extends along the surface of substrate 30. The gate dielectric layer 32 may be formed of Silicon dioxide ("oxide") or other suitable dielectric material. A first layer of conductive material 34 overlies gate dielectric layer 32 and is patterned into separate floating gates of memory cells. The first conductive layer 34 may be formed from doped polysilicon. A dielectric layer 36 overlies first conductive layer 34. A second conductive layer 38 overlies the dielectric layer 36. The second conductive layer may be formed of doped polysilicon and may be deposited in two deposition steps. The dielectric layer 32 may be referred to as Inter Poly Dielectric (IPD) because it is located between polysilicon layers 34 and 38. Even where other materials (e.g. metals) are used instead of polysilicon, the term "IPD" may be applied to a dielectric that separates a control gate and a floating gate. Openings 40 in dielectric layer 36 allow contact between the first and second polysilicon layers in certain locations. Similar openings may be formed in peripheral areas to form transistors in peripheral regions that have unitary gates rather than separate control and floating gates (like memory cells). A layer of metal 42 overlies the second polysilicon layer 38. A suitable metal may be Tungsten, with a suitable barrier layer (e.g. Tungsten Nitride or similar layer). The cross-section of FIG. 3 shows the structure after patterning (e.g. after forming a layer of resist, performing photolithographic patterning of the resist, and performing anisotropic etching such as RIE) to form separate memory cells 44 which each include a floating gate and a control gate. An individual control gate is formed of a portion of second conductive layer 38 and metal layer 42 where they overlie a floating gate formed by a portion of conductive layer 34. The control gate is electrically isolated from the floating gate by a portion of dielectric layer 36 which thus permits some capacitive coupling while preventing current flow between these elements.

In contrast to floating gate memory cells 44, select transistors 46 do not include floating gates. Openings 40 provide electrical contact between floating gate polysilicon layer 34 and control gate polysilicon layer 38 so that a single electrically continuous body is formed that acts as an active gate (unitary gate) of the select transistor.

Figure 4:
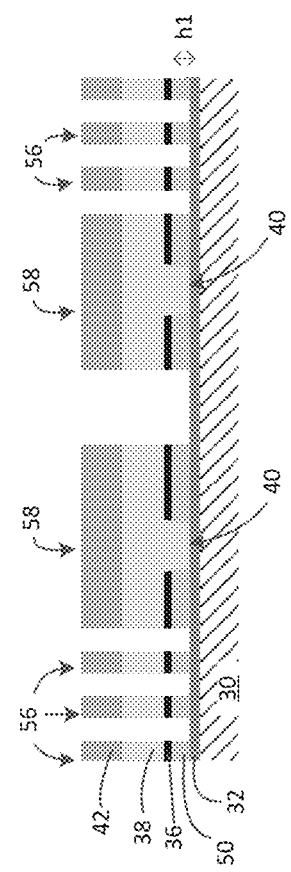
FIG. 4 illustrates select transistors with a thin floating gate layer.

In general, dimensions of semiconductor devices including NAND flash memories, become smaller as technology progresses. One dimension that may become smaller is the height of a floating gate layer (e.g. floating gate polysilicon layer). While FIG. 3 shows floating gate layer 34 having a height h, FIG. 4 shows a floating gate layer 50 with a thickness h1, which is significantly less than h. This reduction in floating gate layer thickness may have consequences, including some that affect select transistor formation.

When openings 40 in FIG. 3 are etched through IPD layer 36 and into floating gate layer 34, the thickness of floating gate layer 34 is sufficient to ensure that etching does not reach gate dielectric layer 32, or substrate 30. However, in FIG. 4, etching through IPD layer 36 and into thin floating gate layer 50 carries a risk of damaging gate dielectric 32 and substrate 30. For example, etching through gate dielectric 32 may cause a short between a select line and the substrate by allowing control gate polysilicon 38 to lie in contact with surface 30. Even partially etching gate dielectric layer 32 may affect select transistor threshold voltage so that such a select transistor may not adequately control a corresponding NAND string (i.e. may not turn on and off with specified voltages). As h1 becomes smaller, it becomes increasingly difficult to provide a reliable contact between a control gate layer and a floating gate layer in a select transistor. Accordingly, alternative structures and methods of forming such structures may be beneficial.

Sidewall Connection

Figure 5:
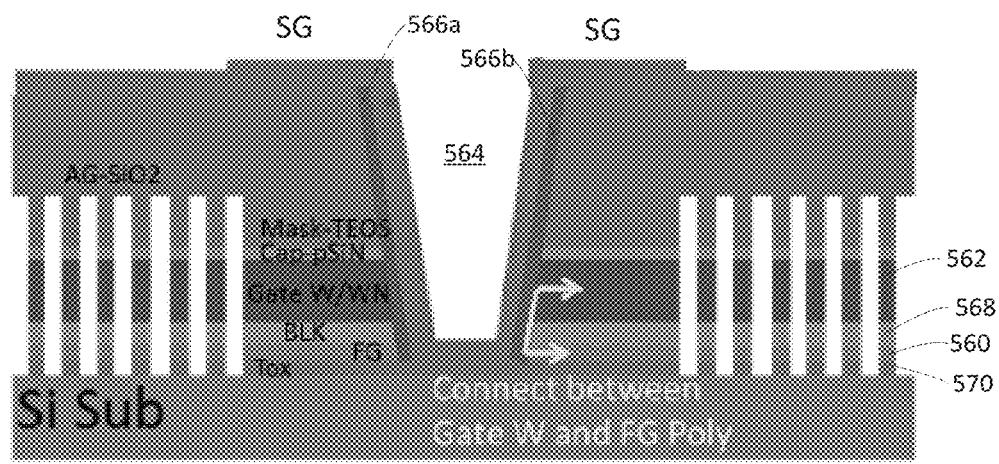
FIG. 5 illustrates an example of select gates with conductive strips.

FIG. 5 shows a first example of a structure that connects a floating gate layer 560 and a control gate layer 562. In particular, FIG. 5 shows two select gates ("SG") that are separated by an opening, trench 564, in which conductive strips 566a-b are formed along sidewalls to connect floating gate layer 562 and control gate layer 560 in each select gate. Thus, instead of etching vertically through IPD layer 568 (blocking layer "BLK") in a separate etch step (as in prior art example of FIG. 3) so that a control gate layer can directly overlie (and make contact with) a floating gate layer, here the opening (trench 564) formed to separate floating gates is used to add conductive strips 566a-b that contact sides of both the control gate layer 562 and the floating gate layer 560. Thus, an additional element (conductive strip) is added and there is no need for a separate etch step to etch through IPD layer 568 stopping short of gate dielectric layer 570 (tunnel oxide, "Tox"). This structure is not dependent on having sufficient thickness of floating gate polysilicon to protect the gate dielectric. Thus, this structure can be formed with a very thin floating gate layer.

Conductive strips may be formed in various ways and of any suitable conductive material. Tapered openings may be formed with sidewalls that form oblique angles with respect to the surface of the substrate. Such inclined sidewalls may facilitate good sidewall coverage when forming conductive strips. Alternatively, sidewalls may be vertical or near vertical. Conductive strips may be formed of any appropriate conductive material such as a metal, doped amorphous silicon, doped polysilicon, or other conductive material.

Figure 6A:
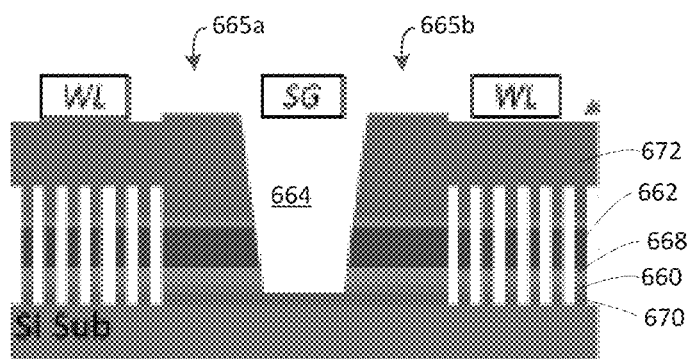
FIGS. 6A-D illustrate an example of formation of select gates of FIG. 10.

FIGS. 6A-D illustrate an example of a series of steps that may be used to form a NAND flash memory with select gates that include conductive strips as shown in FIG. 5. FIG. 6A shows a substrate at an intermediate stage of fabrication after patterning to form individual word lines ("WL") and floating gates separated by air gaps. An air gap cap layer 672 (of silicon oxide in this example) extends over the word lines. A trench 664 extends in the select gate area to separate two select gates 665a-b and provide an opening where contacts may be formed. The trench 664 extends down to an upper surface of gate dielectric layer 670 and may be etched using the gate dielectric layer 670 as an etch stop layer. The structure of FIG. 6A may be formed by any suitable series of process steps. Trench 664 has inclined sidewalls along which side surfaces of control gate layer 662 (e.g. tungsten, and/or polysilicon) and floating gate layer 660 (e.g. floating gate polysilicon) are exposed (separated by IPD layer 668).

Figure 6B:
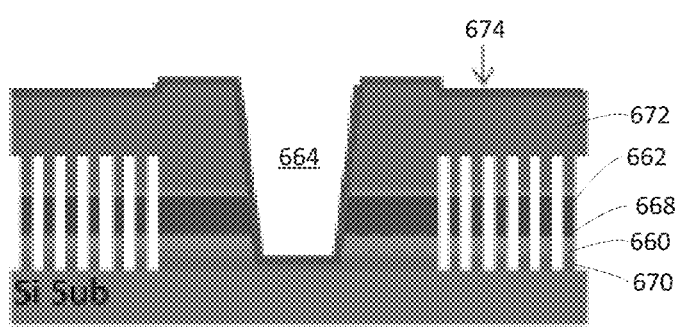

FIG. 6B shows the structure of FIG. 6A after deposition of a layer 674 of conductive material (e.g. metal, doped amorphous silicon, etc.). Conductive layer 674 covers sides of trench 664 and lies in direct physical contact with both control gate layer 662 and floating gate layer 660.

Figure 6C:
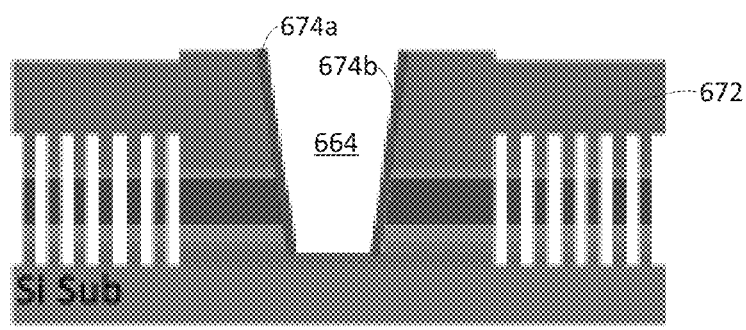

FIG. 6C shows the result of anisotropic etching of conductive layer 674 to leave conductive strips 674a-b on sidewalls of trench 664. Conductive material is removed from horizontal surfaces including from over air gap capping layer 672 and from bottom of trench 664. Thus, conductive strips 674a-b are separated from each other and remain directly connected only to the floating gate layer and control gate layer in their respective select gates (not connected to each other). It will be understood that conductive strips 674a-b extend along the word line direction (perpendicular to the cross section shown) to provide continuous connection along select lines and such strips may be considered parts of their respective select lines. Not only do such strips provide electrical connection vertically, between control gate and floating gate layers, but also horizontally, along the select lines to thereby reduce select line resistance.

Figure 6D:
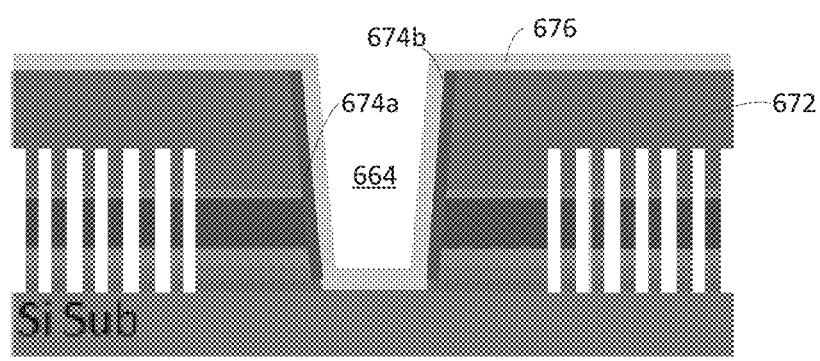

FIG. 6D shows the structure of FIG. 6C after deposition of a dielectric layer 676 over conductive strips 674*a-b*. The dielectric layer 676 may be formed of any suitable dielectric material to provide electrical insulation between conductive strips and subsequently formed structures. In particular, conductive contact plugs (vias) may be formed in trench 664 and dielectric layer 676 provides electrical isolation between conductive strips and contact plugs.

Many prior process flows may be modified according to the above steps to form unitary select gates without dedicated patterning and etching through IPD. In many cases, just two additional steps, depositing conductive material and etching it back (without alignment or patterning), are sufficient to adapt a process. Patterning and etching of EI openings, which are common in prior processes are unnecessary. Peripheral transistors may be similarly formed using a conductive strip, or similar conductive connection, to form a unitary gate.

Figure 7A:
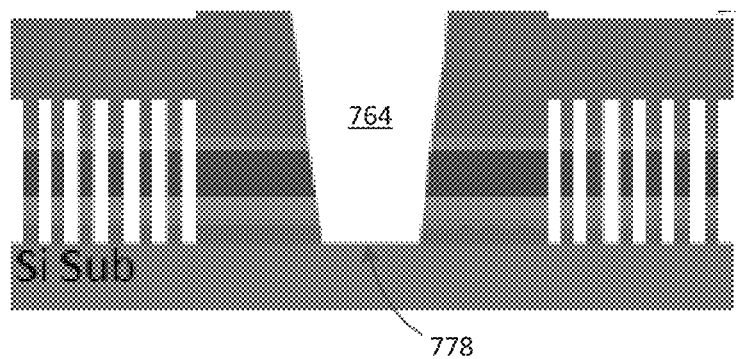
FIGS. 7A-C illustrate alternative steps in forming select gates with conductive strips.
Figure 7B:
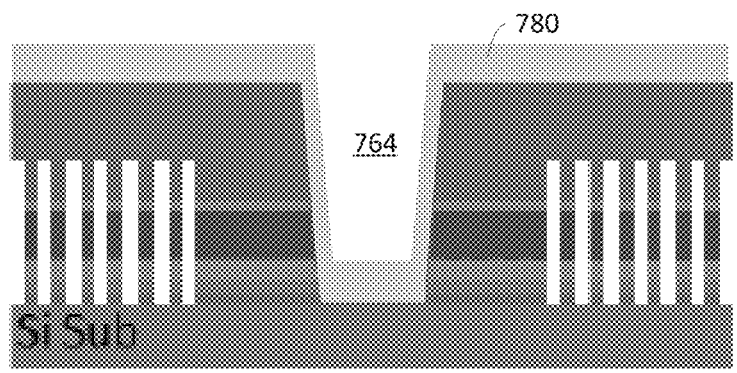
Figure 7C:
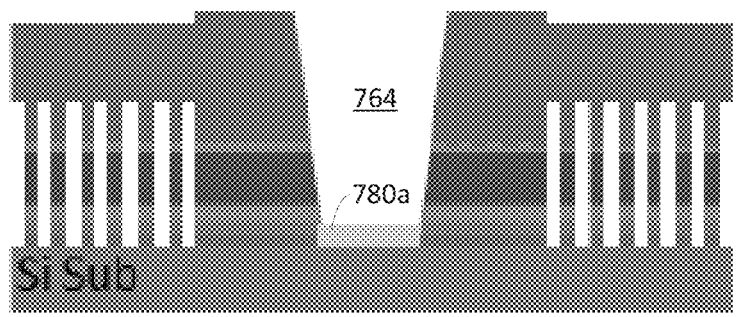

Various alternative implementations may be used to form a structure like that shown in FIG. 5. For example, instead of using gate dielectric 670 as an etch stop layer when forming a trench as shown in FIG. 6A, a trench may continue through a gate dielectric layer, stopping on an upper surface of a substrate as shown in FIG. 7A (trench 764 extends to substrate surface 778). Subsequently, a dielectric layer may be deposited on side and bottom surfaces of trench 764 as shown in FIG. 7B. A dielectric layer may be deposited so that the bottom thickness is greater than the thickness along sidewalls (i.e. step coverage is low). Subsequently, etching may be used to remove dielectric layer 780 from sidewalls of trench while leaving a portion 780*a* of dielectric layer 780 along the bottom of the trench as shown in FIG. 7C. Thus, the bottom surface of the trench 764 is again covered with a suitable dielectric. The thickness and other characteristics of such a dielectric portion may be selected and are not limited to gate dielectric characteristics. Subsequently, processing may proceed as shown in FIGS. 6B-D.

Figure 8A:
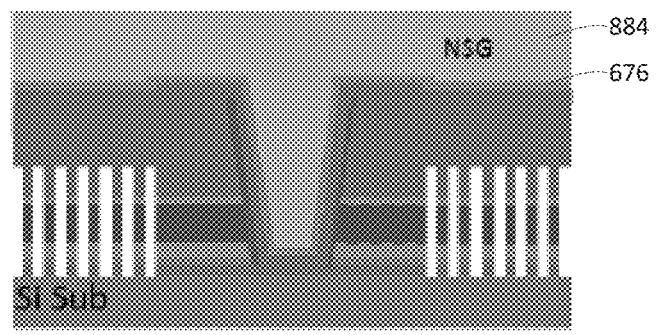
FIGS. 8A-C illustrate additional steps that may be performed.
Figure 8B:
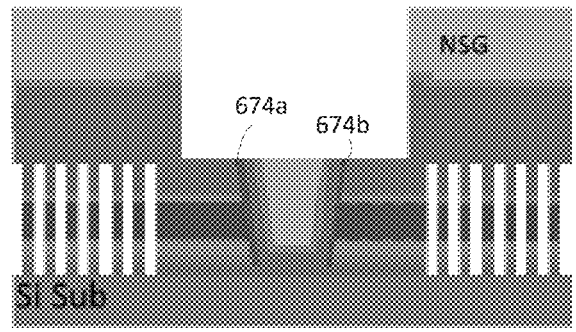
Figure 8C:
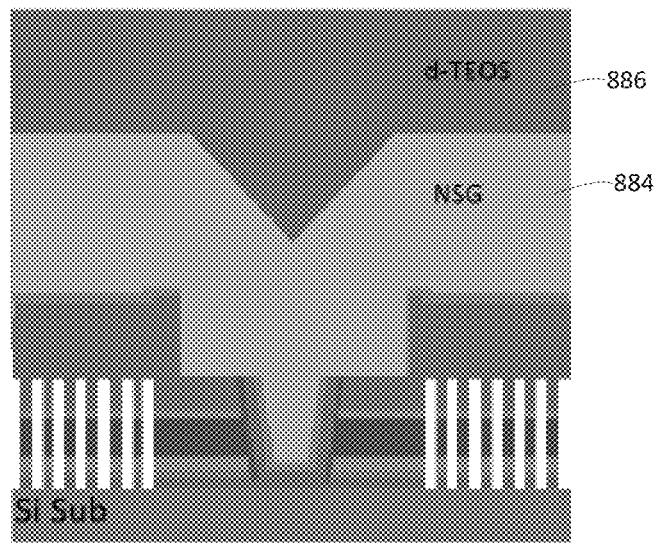

Another alternative process is shown in FIGS. 8A-D. After deposition of dielectric layer 676, trench 664 may be filled with a suitable dielectric, in this case non-doped silicate glass (NSG) 884 as shown in FIG. 8A. Subsequently, etching is performed to remove a portion of the structure including NSG 884 and upper portions of conductive strips 674*a-b* down to a predetermined level (stopping above the upper surface of control gate layer 562) as shown in FIG. 8B. Subsequently, additional NSG 884 and silicon oxide 886 ("d-TEOS") are deposited to refill the etched area. Such reduction in the height of conductive strips 674*a-b* may reduce the risk of shorting between conductive strips and metal layers that are subsequently deposited by increasing the vertical distance between them.

Figure 9:
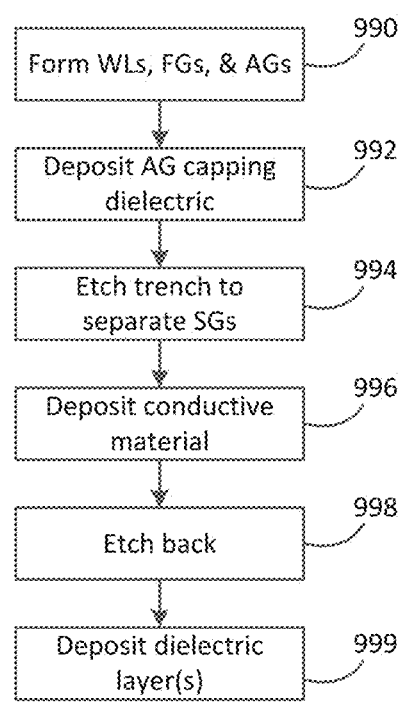
FIG. 9 shows an example of steps that may be used in forming select gates.

FIG. 9 shows an example of a series of steps that may be used to form a NAND flash memory including select gates with conductive strips on sidewalls. Word lines, floating gates, and air gaps between them are formed 990 over a substrate surface. Then an air gap capping layer is formed 992 to protect air gaps. Trenches are then etched 994 in select gate areas to separate select gates (i.e. to form two parallel select lines with an exposed substrate area between where the substrate can be contacted). A conductive material is deposited 996 on sidewalls of the trench. The conductive material is etched back 998 to remove conductive material from horizontal surfaces while leaving strips of the conductive material along sides of the trenches. Subsequently, one or more dielectric layers are deposited over the substrate 999. Contact plugs may subsequently be formed.

Floating Gate Layer Removal

Another example of a select gate that facilitates a thin floating gate layer is shown in FIG. 10. In this example, the select gate has an open area 101 in the middle where gate dielectric 103, floating gate polysilicon 105 (which may be doped or undoped), and IPD layer 107 are removed and replaced with a select gate dielectric layer 109 that includes material with a high dielectric constant ("High-k material") directly underlying the control gate layer 111 (formed of tungsten, "W", in this example). Thus, in open area 101, the control gate tungsten is separated from the channel of the select transistor in substrate 113 by only the select gate dielectric layer 109 and any barrier layer that may be used (e.g. titanium, titanium nitride). There is no need to connect a control gate layer and a floating gate layer in the select transistor because the floating gate layer is removed in open area 101 and the control gate layer 111 replaces floating gate layer 105 in this area so that it directly controls the channel.

FIG. 10 shows select gate dielectric layer 109 extending over the substrate surface in the open area 101 and also over the IPD layer 107 outside the open area. Thus, the select gate dielectric layer 109 acts as part of the IPD layer in other areas (i.e. isolating floating gates from word lines in memory cells). Thus, the IPD layer 107 alone may be thinner than normally required because the additional dielectric added by select gate dielectric layer 109 provides a combined thickness that may be sufficient. IPD layer 109 is formed of an upper layer 109*a* (e.g. hafnium silicide) and a lower layer 109*b* (e.g. silicon oxide). In other examples, a single layer may be used, or three or more layers may be used.

FIG. 10 shows implanted areas 114 on either side of open area 101 of the select transistor. Such implanted areas may be used to reduce threshold voltages of select transistors by reducing their gate length. Thus, the gate length may be approximately equal to the width of an open area which is less than the width of the select gate structure as shown. Implantation may be self-aligned so that gate length (and threshold voltage) are uniformly maintained at their target values.

The select gate of FIG. 10 can be seen to include three regions, a central region, open area 101, in which the control gate is formed, and edge regions on either side in which a portion of floating gate material remains with implanted areas underneath to form source/drain regions. The central region may form a significant portion of the select gate, for example, more than half the width of the select gate. Edges of select gates contain the same gate stack as memory cells which facilitates using the same etch to separate word lines and select lines. Select gate dielectric layer 109 extends along sides of open area 101 to electrically isolate remaining floating gate portions in edge regions from control gate layer. Thus, remaining floating gate portions are floating (electrically isolated) and are not driven by control gate.

The structure of FIG. 10 may be formed by any suitable process. An example of process steps that may be used to form such a structure is provided in FIGS. 11A-J. Various alternatives may also be implemented.

FIG. 11A shows a silicon substrate 113 at an intermediate stage of fabrication of a NAND flash memory. A gate or tunnel dielectric layer 103 extends over the surface of the substrate. A floating gate layer 105 formed of polysilicon (doped or undoped) and silicon nitride ("FG Poly+SiN") extends over the gate dielectric layer. An IPD layer 107 formed of hafnium silicate ("HfSiO") extends over the floating gate layer. The region shown, R11, is where a select gate is to be formed. It will be understood that the layers illustrated extend across the substrate including areas where memory cells are to be formed and may extend into peripheral areas where peripheral transistors are to be formed.

FIG. 11B shows the structure of FIG. 11A after patterning by photolithography to define an open area 101 in a resist layer 115. The open area 101 occupies a central region R12 within region R11 where a select gate is to be formed.

Figure 11C:
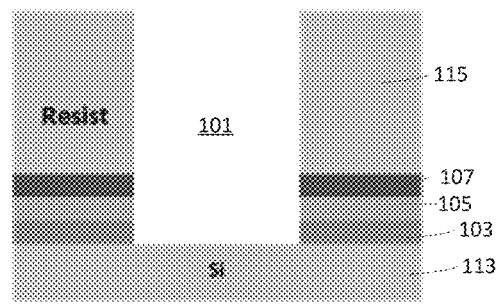

FIG. 11C shows the structure of FIG. 11B after anisotropic etching (e.g. RIE) to extend open area 101 from the resist layer 115 down through IPD layer 107, floating gate layer 105, and gate dielectric layer 103. Etching stops at the surface of substrate 113. Thus, open area 101 forms an opening, or trench, through the gate stack at this stage.

Figure 11D:
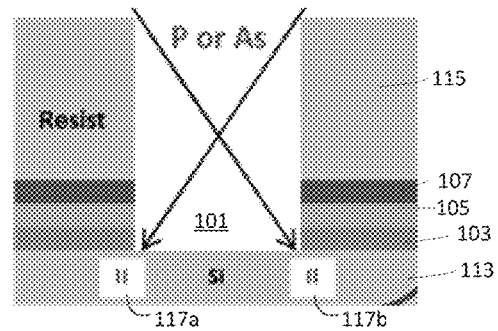

FIG. 11D shows the structure of FIG. 11C during ion implantation. Phosphorous (P), Arsenic (As), or other suitable dopant ions may be implanted through open area 101 in this step in order to modify areas of substrate 113. Implanted areas 117a-b are located under edges of the open area 101 in FIG. 11D. Implantation is discussed further below with respect to FIGS. 12A-B.

Figure 11E:
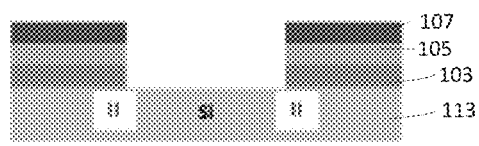

FIG. 11E shows the structure of FIG. 11D after removal of the resist layer 115.

Figure 11F:
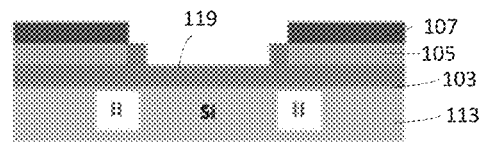

FIG. 11F shows the structure of FIG. 11E after formation of an oxide layer 119 to remove implantation damage. Oxide layer 119 may be a grown oxide that consumes damaged silicon along the surface of the substrate 113.

Figure 11G:
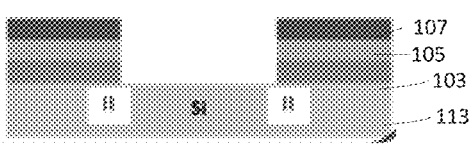

FIG. 11G shows the structure of FIG. 11F after removal of oxide layer 119 to expose the upper surface of the substrate 113, which has reduced implantation damage as a result of consumption of damaged silicon in the oxide layer 119 and its subsequent removal. In some cases, implantation damage may not be significant so that formation and removal of such an oxide layer may not be necessary. Thus, formation and removal of such a layer may be considered optional.

Figure 11H:
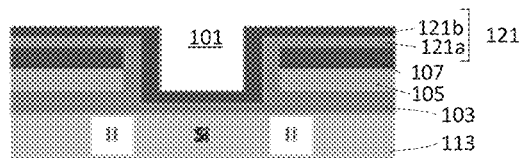

FIG. 11H shows the structure of FIG. 11G after deposition of a select gate dielectric layer 121, which in this example is a compound layer formed of a lower layer 121a of silicon oxide and an upper layer 121b of hafnium silicate. Silicon oxide and hafnium silicate may be deposited by any suitable method, for example, chemical vapor deposition (CVD). Select gate dielectric layer 121 directly overlies the surface of substrate 113 in the open area 101. Select gate dielectric layer 121 overlies IPD layer 107 outside open area 101 so that a three-layer IPD layer is formed of HfSiO/SiO/HfSiO (IPD layer 107 plus select gate dielectric layer 121) in these regions.

Figure 11I:
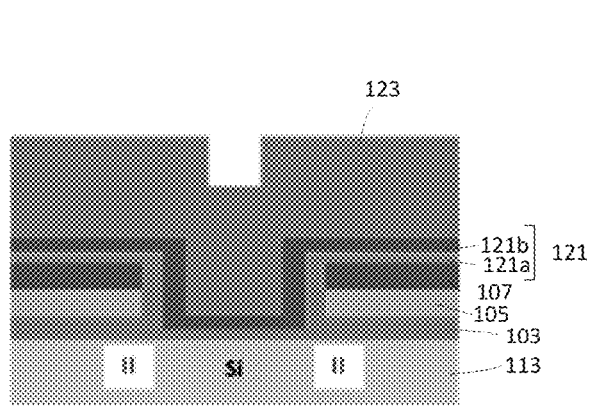

FIG. 11I shows the structure of FIG. 11H after deposition of a control gate layer 123, which in this example is formed of tungsten. In other examples, some other metal, metal silicide, polysilicon, or some combination of materials may be used to form a control gate layer.

Figure 11J:
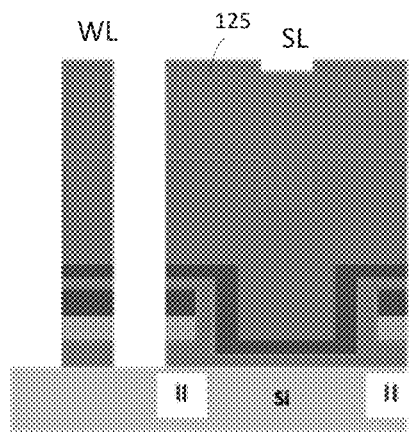

FIG. 11J shows the structure of FIG. 11I after patterning and etching. A resist layer 125 is formed and patterned by photolithography to form an etch mask. Subsequent anisotropic etching through the etch mask separates word lines and select lines as shown, with the same stack of layers etched along edges of select lines and word lines (though interior portions of select lines have a different structure).

Figure 12A:
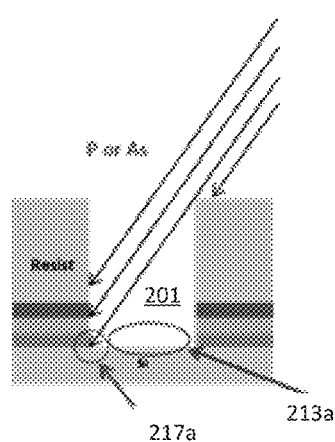
FIGS. 12A-B illustrate selective implantation through an opening.
Figure 12B:
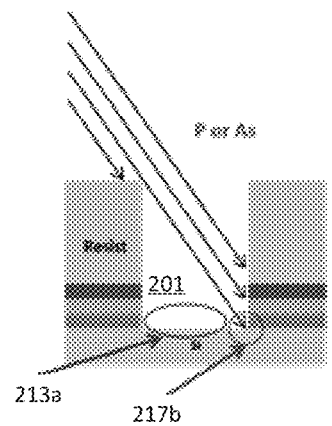

FIGS. 12A-B illustrate how ion implantation may be used to selectively form implanted regions to thereby reduce the gate length of a select transistor. FIG. 12A shows a first implantation step that forms an implanted area 217a at one edge of an open area 201 by implanting obliquely through open area 201. The angle of implantation may be selected to appropriately limit implantation to an area close to the edge of open area 201. In particular, a central portion 213a of the area of substrate surface that is exposed at the bottom of open area 201 is not implanted in this step because it is shadowed by photoresist. Implantation may extend under an edge region so that a source/drain area is formed in the substrate under the edge region. FIG. 12B shows a second implantation step that forms an implanted area 217b at the other edge of open area 201. The second implantation step may use the same angle, dopant (e.g. P or As), and dose as the first implantation step, from an opposite side of opening 201, to produce implanted areas that are similar (mirror image). Central portion 213a is not implanted by the second implantation and thus remains with little or no implanted dopant at this point.

Figure 13A:
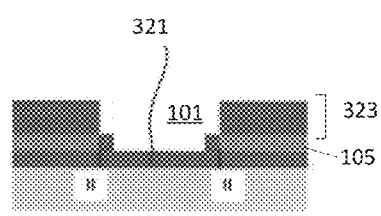
FIGS. 13A-B illustrate an alternative select gate dielectric formation technique.
Figure 13B:
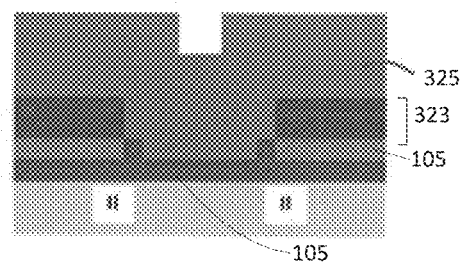

The above process may be modified in various ways. For example, FIGS. 13A-B show an example in which, after an open area is formed, thermal silicon oxide 321 is grown in the open area as a select gate dielectric layer. Thus, instead of depositing a select gate dielectric layer over the substrate as shown in FIG. 11H, thermal silicon oxide 321 is selectively grown only where silicon is exposed in open area 101 (e.g. in FIG. 11G), and along sides of floating gate layer 105. Thus, there is no select gate dielectric layer deposited over a previously deposited IPD layer in this example. Accordingly, a multi-layer IPD layer 323 is provided that is sufficient to provide isolation between floating gates and control gates without any additional layer. Multi-layer IPD layer 323 may include various materials including silicon oxide, hafnium silicate, and/or other dielectric materials. FIG. 13B shows the structure of FIG. 13A after deposition of a control gate layer 325 (e.g. tungsten). Control gate layer 325 is separated from the substrate surface and by thermal silicon oxide 321. Thermal silicon oxide 321 may also electrically isolate control gate layer 325 from floating gate layer 105 as shown. In other examples, these layers may make contact.

Figure 14:
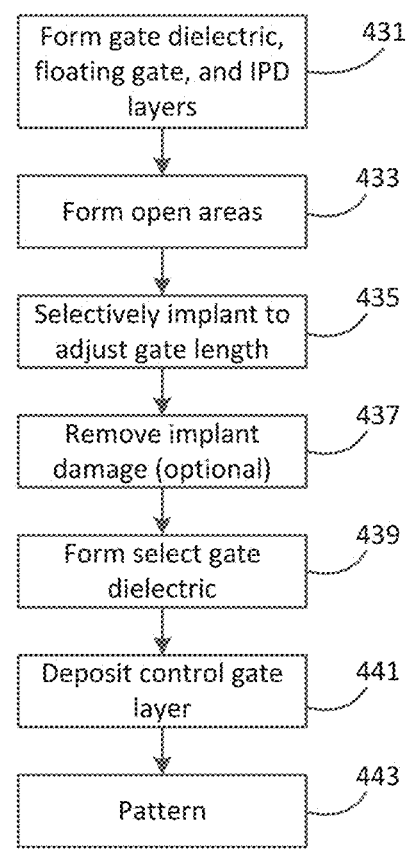
FIG. 14 shows an example of process steps used to form a select gate.

FIG. 14 illustrates an example of steps in forming a NAND flash memory array. A stack including gate dielectric, floating gate, and IPD layers is formed 431. Then open areas are etched 433 in central areas of select gate areas. Ion implantation is performed 435 through the open areas to selectively implant under edges of open areas and thereby adjust the gate length of select transistors. Implantation damage may then be removed 437 (if appropriate). Then a select gate dielectric is formed 439, for example, by depositing a blanket layer, or by selectively forming a gate dielectric in open areas. Then, a control gate layer is deposited 441 over the select gate dielectric. Patterning 443 then separates word lines and select lines so that each select transistor has a central region where the control gate layer lies close to the channel (separated by select gate dielectric), and edge regions where portions of floating gate and IPD remain.

Select Gate Dielectric First

Figure 15:
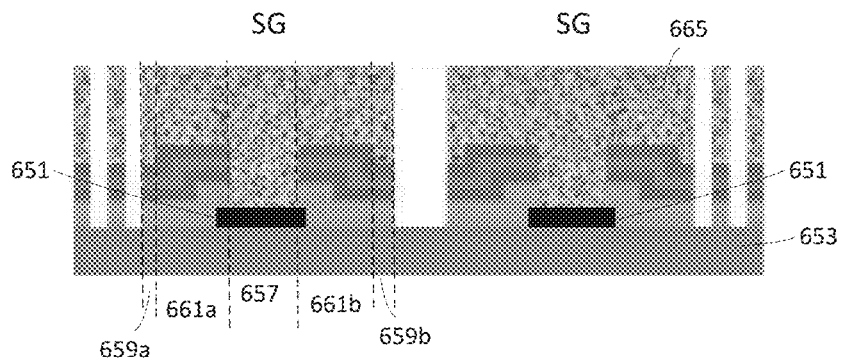
FIG. 15 shows an example of select gates in which select gate dielectric is formed first.
Figure 16:
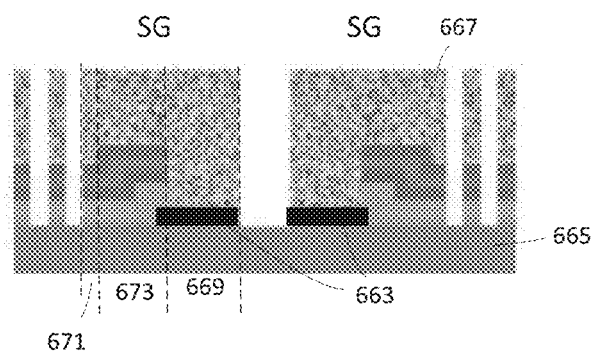
FIG. 16 shows another example of select gates with dielectric formed first.

FIGS. 15 and 16 show two alternative structures that may be formed by depositing a select gate dielectric first, before a gate stack is deposited, so that the select gate dielectric may be different to the gate dielectric used for memory cells and may have characteristics that facilitate formation of a select transistor. This results in a select transistor structure that includes a first region where the gate stack extends over the substrate surface and a second region where the control gate layer (e.g. tungsten) directly controls the transistor channel (i.e. area where the gate stack is removed). Unlike the example of FIG. 10, here, because the select gate dielectric is formed first, the gate stack extends over the select gate dielectric in a transition region between first and second regions. Also, the control gate layer makes contact with the floating gate layer so that remaining portions of the floating gate layer in the select transistor are driven by the select line and are not floating.

FIG. 15 shows two select gates that each have select gate dielectric portion 651 between a substrate 653 and a control gate layer 655 in a central region 657 and have a gate stack on the substrate in edge regions 659a-b on either side of the central region 657. The gate stack rises from the substrate 653 to extend over the select gate dielectric portion 651 in transition regions 661a-b on either side of the central region 657.

FIG. 16 shows two select gates that each have a select gate dielectric 663 between a substrate 665 and a control gate layer 667 in a first region 669 that extends to a first edge and have a gate stack on the substrate in second region 671. The gate stack rises from the substrate 665 to extend over the select gate dielectric portion 663 in a transition region 673 between the first and second regions.

The structures of FIGS. 15-16 may be formed by any suitable process. The process described above with respect to 11A-J formed an opening through a gate stack and then formed a select gate dielectric in the opening. In contrast, a process described below with respect to FIGS. 17A-C forms a select gate dielectric portion first, then forms a gate stack over the select gate dielectric portion. Subsequently, an opening is formed through the gate stack over the select gate dielectric portion. The opening is aligned with the select gate dielectric portion and some margin for alignment error may be provided (e.g. select gate dielectric portion may be wider than the opening).

Figure 17A:
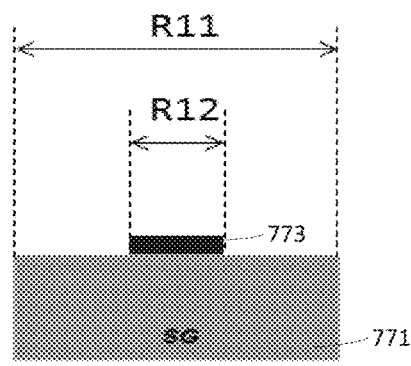
FIGS. 17A-C show an example of formation of select gates of FIGS. 15-16.

FIG. 17A shows a substrate 771 with a select gate dielectric portion 773 formed on the substrate surface by depositing a blanket layer or layers, then patterning and etching to leave portion 773 as shown. The region shown, R11, is a select gate area and may represent an area where a single select gate is to be formed (FIG. 15) or where two select gates (and contact areas in between) are to be formed (FIG. 16). The region R12 where the portion of select gate dielectric extends represents a central region of the select gate area.

The gate dielectric portion 773 may consist of a layer of a suitable gate dielectric material (e.g. silicon oxide) alone, or may include an additional layer or layers. For example, a polysilicon layer may overlie the dielectric layer. In one example, a portion of silicon oxide that is approximately nine nanometers (9 nm) thick lies directly on the substrate surface with a portion of polysilicon that is approximately seven nanometers (7 nm) thick directly overlying the portion of polysilicon. Polysilicon may be doped or undoped. In another example, a portion of silicon oxide alone that has a thickness of about twelve nanometers (12 nm) is used.

Figure 17B:
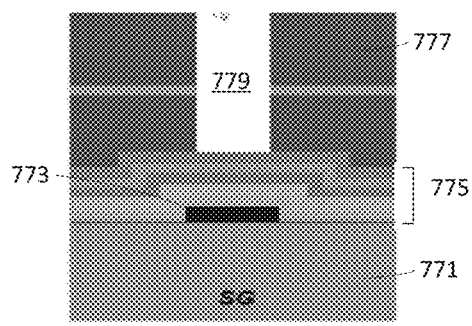

FIG. 17B shows the structure of FIG. 17A after deposition of a gate stack 775 over the substrate surface and the select gate dielectric portion 773. The gate stack 775 includes multiple layers including a gate dielectric layer, a floating gate layer, and one or more IPD layers. A mask layer 777 is formed over the gate stack 775. In this example, a stacked mask process (SMAP) uses multiple layers with a photoresist layer on the top that is patterned by photolithography, the pattern then transferred to underlying layers. An opening 779 is formed that extends through mask layer 777 over the select gate dielectric portion 773 (i.e. opening pattern is aligned so that openings overlie select gate dielectric portions).

Figure 17C:
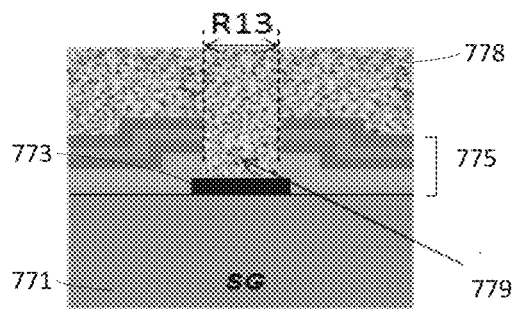

FIG. 17C shows the structure of FIG. 17B after anisotropic etching to extend opening 779 through the gate stack 775 while leaving the select gate dielectric portion 773 intact. Etching may stop at an upper surface of select gate dielectric portion 773 (e.g. using a selective etch for at least a portion of the etching) or may stop in a portion of material, such as polysilicon, that directly overlies the select gate dielectric portion. While stopping an etch accurately in a very thin floating gate polysilicon layer (e.g. five nanometer thick layer) may be difficult to achieve reliably, a thicker layer (e.g. seven nanometers of polysilicon on the select gate dielectric portion) may be sufficiently thick to allow etching through the gate stack without etching select gate dielectric. Polysilicon may be used as an etch stop layer or etching may continue through polysilicon and may stop on the select gate dielectric. After etching, mask layer 777 is removed and control gate material 778 (e.g. tungsten) is deposited to fill opening 779 and overlie the gate stack 775.

It will be understood that memory cells remain covered by mask layer 777 during the etching of opening 779 so that the gate stack in memory cells remains unaffected during this step. Peripheral areas may include openings so that the gate stack is at least partially etched through in peripheral areas. For example, where peripheral transistors are to be formed, the mask pattern may contain openings so that the gate stack may be etched similarly to form peripheral transistors with unitary gates.

The structure of FIG. 17C is then patterned to from individual select lines and word lines. Two patterning examples are shown. In FIG. 15 (which divides a single select gate dielectric portion between two select lines by etching through the select gate dielectric) the same layers are etched on one side of select lines and between word lines. In FIG. 16 (in which each select line has its own select gate dielectric portion) the same layers are etched at both sides of select lines and between word lines.

Figure 18:
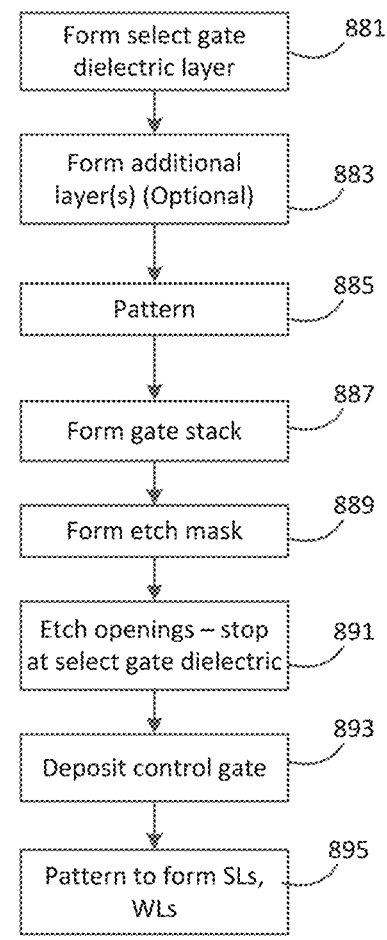
FIG. 18 shows an example of process steps used to form a select gate.

FIG. 18 shows an example of steps used to form a NAND flash memory that facilitates formation of select transistors with a thin floating gate layer. A select gate dielectric layer is formed 881 on a substrate surface and an optional layer, or layers, may be formed 883 over the select gate dielectric layer. Then, patterning is applied 885 to leave select gate dielectric portions in areas where select gates are to be formed. Subsequently, a gate stack is deposited 887 that contains a number of layers including a gate dielectric, floating gate layer, and IPD layer. An etch mask is formed 889 in alignment with the select gate dielectric portions. Then, openings are etched 891 through the gate stack stopping at the select gate dielectric, or above, in an additional overlying layer (if provided). Peripheral areas may also be etched at this stage so that IPD is removed where peripheral transistors are to be formed. A control gate layer (e.g. metal such as tungsten, or polysilicon) is deposited 893 to fill openings. Subsequently, patterning is performed 895 to separate select lines and word lines.

CONCLUSION

Although the various aspects have been described with respect to examples, it will be understood that protection within the full scope of the appended claims is appropriate.

It is claimed:
1. A NAND flash memory array comprising:
   a plurality of word lines extending in a first direction over a substrate surface;
   a plurality of select lines extending in the first direction over the substrate surface; and
   an individual select line having a first edge region containing a first portion of floating gate material and a second edge region containing a second portion of floating gate material, and having a central region between the first edge region and the second edge region where no floating gate material is present.

2. The NAND flash memory of claim 1 wherein, in the central region, a conductive metal layer directly overlies a dielectric layer that directly overlies the substrate surface, and in the first and second edge regions, the conductive metal layer overlies the first and second portions of floating gate material and is separated from the first and second portions of floating gate material by the dielectric layer.

3. The NAND flash memory of claim 2 wherein the first and second portions of floating gate material are isolated from the substrate by a tunnel dielectric layer.

4. The NAND flash memory of claim 1 further comprising first and second implanted areas in the substrate, the first and second implanted areas located under the first and second edge regions.

5. The NAND flash memory of claim 4 further comprising an unimplanted area in the substrate, the unimplanted area of the substrate located under the central region of the select line, between the first and second implanted areas and having no implanted dopant or low implanted dopant concentration compared with the first and second implanted areas.

6. The NAND flash memory of claim 1 wherein the first and second edge regions contain a stack of layers on a substrate surface comprising:
   a tunnel dielectric layer on the substrate surface;
   a floating gate layer on the tunnel dielectric layer;
   a first interpoly dielectric (IPD) layer on the floating gate layer;
   a second IPD layer on the first IPD layer,
   a third IPD layer on the second IPD layer; and
   a conductive metal layer on the third IPD layer.

7. The NAND flash memory of claim 6 wherein the central region contains a stack of layers on the substrate comprising:
   the second IPD layer directly on the substrate surface;
   the third IPD layer on the second IPD layer; and
   the conductive metal layer on the third IPD layer.

8. The NAND flash memory of claim 7 wherein the tunnel dielectric layer is formed of silicon oxide, the floating gate layer is formed of polysilicon, the first IPD layer is formed of hafnium silicate, the second IPD layer is formed of silicon oxide, the third IPD layer is formed of hafnium silicate, and the conductive metal layer is formed of tungsten.

9. The NAND flash memory of claim 6 wherein the central region contains a stack of layers on the substrate comprising:
   a select gate dielectric layer lying directly on the substrate surface, the select gate dielectric layer consisting of silicon oxide; and
   the conductive metal layer directly on the select gate dielectric layer.

10. A method of forming a NAND flash memory array comprising:
    forming a tunnel dielectric layer directly on a substrate surface;
    forming a floating gate layer directly on the tunnel dielectric layer;
    forming a first dielectric layer directly on the floating gate layer;
    subsequently forming an opening through the first dielectric layer, through the floating gate layer, and through the tunnel dielectric layer in a central area where a select line is to be formed;
    subsequently forming a second dielectric layer that overlies the first dielectric layer and extends along exposed surfaces of the opening;
    subsequently depositing a control gate layer over the second dielectric layer; and
    subsequently patterning and etching to form separate word lines and select lines, the patterning and etching forming the select line with edge areas on either side of the central area, the edge areas containing electrically isolated portions of the floating gate layer.

11. The method of claim 10 wherein the electrically isolated portions of the floating gate layer are isolated from the control gate layer by the second dielectric layer.

12. The method of claim 11 wherein the second dielectric layer is formed directly on the substrate surface in the central area thereby forming a gate dielectric for select transistors.

13. The method of claim 10 further comprising, subsequent to forming the opening through the first dielectric layer and through the floating gate layer, implanting portions of the substrate through the opening.

14. The method of claim 13 wherein implanting includes implantation of at least one of: arsenic and phosphorous.

15. The method of claim 13 wherein the implanting is performed with ions directed at oblique angles to the substrate surface so that implanted portions of the substrate are substantially confined to the edge areas.

16. The method of claim 15 further comprising, subsequent to the implanting, forming a silicon oxide layer along the substrate surface in the opening and subsequently removing the silicon oxide layer to expose the substrate surface.

* * * * *